(12) United States Patent  
Groe (10) Patent No.: US 7,061,341 B1
(45) Date of Patent: *Jun. 13, 2006

(54) SYSTEM FOR HIGHLY LINEAR PHASE MODULATION (75) Inventor: John Groe, Poway, CA (US)

(73) Assignee: Sequoia Communications Corp., San Diego, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 10/879,715

(22) Filed: Jun. 26, 2004

Related U.S. Application Data (63) Continuation of application No. 10/420,952, filed on Apr. 21, 2003, now Pat. No. 6,774,740.

(60) Provisional application No. 60/374,040, filed on Apr. 19, 2002.

(51) Int. Cl.
*H03C 3/00* (2006.01)
*H04L 27/20* (2006.01)

(52) U.S. Cl. .................. 332/103; 332/105; 375/308

(58) Field of Classification Search ........ 332/103–105, 332/144–148; 331/23; 375/308, 376; 455/42, 455/110, 112
See application file for complete search history.

(56) References Cited

U.S. PATENT DOCUMENTS 4,743,867 A * 5/1988 Smith .................... 332/127

* cited by examiner

*Primary Examiner*—David Mis (57) ABSTRACT

System for highly linear phase modulation. Apparatus is provided for linear phase modulation utilizing a phase-locked loop (PLL). The apparatus includes a PLL utilizing fractional N synthesis to realize a non-integer divide value. A two-port voltage-controlled oscillator includes a first port controlled by the phase-locked loop and a second port accessed for direct modulation. A second input to the fractional-N phase-locked loop is provided to remove the modulation introduced at the second port. Lastly, a calibration loop is provided wherein a frequency offset applied at the second port is adjusted until it cancels the effects of a known frequency offset introduced to the fractional-N phase-locked loop.

8 Claims, 11 Drawing Sheets

SYSTEM FOR HIGHLY LINEAR PHASE MODULATION

CROSS REFERENCE TO RELATED APPLICATIONS

This Application is a Continuation of U.S. patent application Ser. No. 10/420,952 filed on Apr. 21, 2003, now U.S. Pat. No. 6,774,740. The application Ser. No. 10/420,952 claims the benefit of priority from a U.S. Provisional Patent Application entitled "HIGHLY LINEAR PHASE MODULATION" Ser. No. 60/374,040 filed on Apr. 19, 2002, the disclosure of which is incorporated by reference herein in its entirety for all purposes.

FIELD OF THE INVENTION

The present invention relates generally to phase modulators, and more particularly, to a highly linear architecture for direct phase modulation of a phase-locked loop.

BACKGROUND OF THE INVENTION

Phase modulation schemes—techniques that convey information using the phase of the carrier signal—are effective communication methods. A popular phase modulation scheme is quaternary phase shift keying (QPSK).

Figure 1:
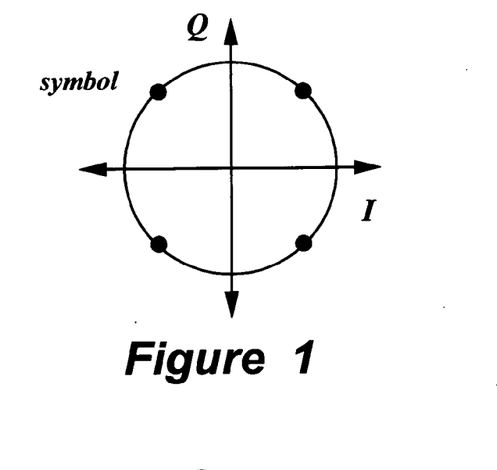
FIG. 1 shows a constellation diagram that illustrates how QPSK maps two-bit digital data to one of four offsets.
Figure 2:
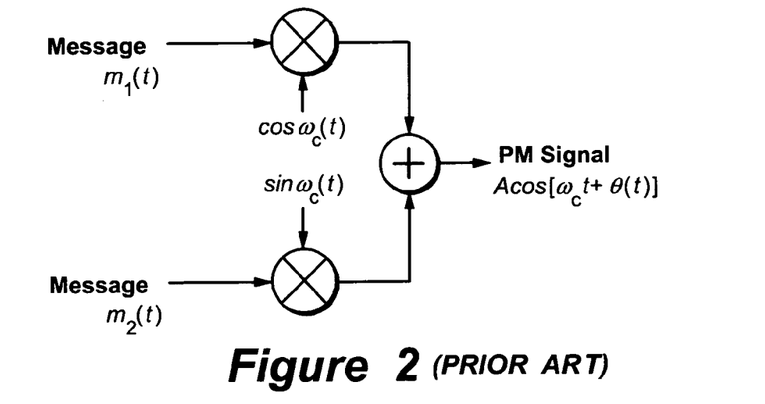
FIG. 2 shows a diagram of a typical I/Q modulator.

FIG. 1 shows a constellation diagram that illustrates how QPSK maps two-bit digital data to one of four offsets. FIG. 2 shows a typical QPSK (or I/Q) modulator used to generate a phase-modulated signal. This technique relies on orthogonal signal vectors to realize the phase offsets—an inherently linear technique, since it depends solely on the matching of these orthogonal signals.

However, the typical I/Q modulator requires several power-consuming circuits to generate the orthogonal signals. It would therefore be advantageous to have a low-power highly linear phase modulator that is highly integrated.

SUMMARY OF THE INVENTION

The present invention comprises a very efficient system for highly-linear phase modulation. The system includes important calibration circuitry for direct modulation of the VCO used in a phase-locked loop to synthesize a radio frequency carrier signal.

In one embodiment, apparatus is provided for linear phase modulation utilizing a phase-locked loop (PLL). The apparatus includes a PLL utilizing fractional N synthesis to realize a non-integer divide value. A two-port voltage-controlled oscillator includes a first port controlled by the phase-locked loop and a second port accessed for direct modulation. A second input to the fractional-N phase-locked loop is provided to remove the modulation introduced at the second port. Lastly, a calibration loop is provided wherein a frequency offset applied at the second port is adjusted until it cancels the effects of a known frequency offset introduced to the fractional-N phase-locked loop.

In one embodiment, apparatus is provided for linear phase modulation utilizing a phase-locked loop. The apparatus comprises a phase-locked loop (PLL), utilizing fractional N synthesis, where an N counter in a feedback loop is pseudo-randomly switched between integer values to realize a non-integer divide value. The apparatus also comprises a two-port voltage-controlled oscillator, the first port controlled by the phase-locked loop and a second port accessed for direct modulation. In one embodiment, the second port utilizes MOSFET capacitors that present an effective capacitance to the voltage-controlled oscillator equal to the time-averaged value of two capacitances, the value linearly changing with the applied control voltage. A second input to the fractional-N phase-locked loop is provided to remove the phase modulation introduced at the voltage-controlled oscillator. Lastly, a calibration loop is provided wherein a frequency offset applied at the voltage-controlled oscillator's second port is adjusted until it cancels the effects of a known frequency offset introduced to the fractional-N phase-locked loop.

In another embodiment included in the present invention, apparatus is provided for calibration of a phase-locked loop used for phase modulation. The apparatus comprises a sampling circuit that stores the control voltage of the phase-locked loop. The control voltage indicates the nominal operating point of the loop. A window comparator is provided that compares the sampled control voltage and nominal operating point of the loop to the present control voltage after modulation is applied. A control network accepts the output of the window comparator and properly sets a memory register used to control a digital-to-analog converter. Lastly, a digital-to-analog converter generates the reference level for a second digital-to-analog converter for inputting digital phase modulation data.

In another embodiment included in the present invention, a method is provided for calibration of a phase-locked loop used for phase modulation. The method comprises steps of sampling the control voltage when the phase-locked loop is phase locked and operating normally, altering the data input applied to the N counter of the phase-locked loop so as to shift its operating frequency, stepping the data input applied to the phase modulation input that directly connects to the second control port of the voltage-controlled oscillator of the phase-locked loop so as to achieve a frequency shift, monitoring the control voltage of the phase-locked loop and comparing it to the sampled control voltage corresponding to the nominal operating point of the phase-locked loop and measured before the frequency offset data was applied, and adjusting the scaling factor or reference level associated with the digital-to-analog converter used to convert the phase modulation digital input to an analog signal until the frequency shift introduced by way of the phase modulation input and voltage-controlled oscillator cancels the programmed frequency offset entered by way of the N counter of the phase-locked loop as measured by the window comparator, which compares the sampled and current values of the phase-locked loop's control voltage.

In another embodiment included in the present invention, a method is provided for sampling the control voltage of a phase-locked loop using a digital-to-analog converter. The method comprises steps of establishing an adjustable reference using a pair of resistors, connected to a fixed bias current source and a variable current source, comparing the adjustable reference to the control voltage to be duplicated, and adjusting the digital input to a digital-to-analog converter, used to create the variable current source that offsets the adjustable reference, until the reference matches the control voltage to be sampled.

BRIEF DESCRIPTION OF THE DRAWINGS

The foregoing aspects and the attendant advantages of the embodiments described herein will become more readily apparent by reference to the following detailed description when taken in conjunction with the accompanying drawings wherein.

DETAILED DESCRIPTION

Figure 3:
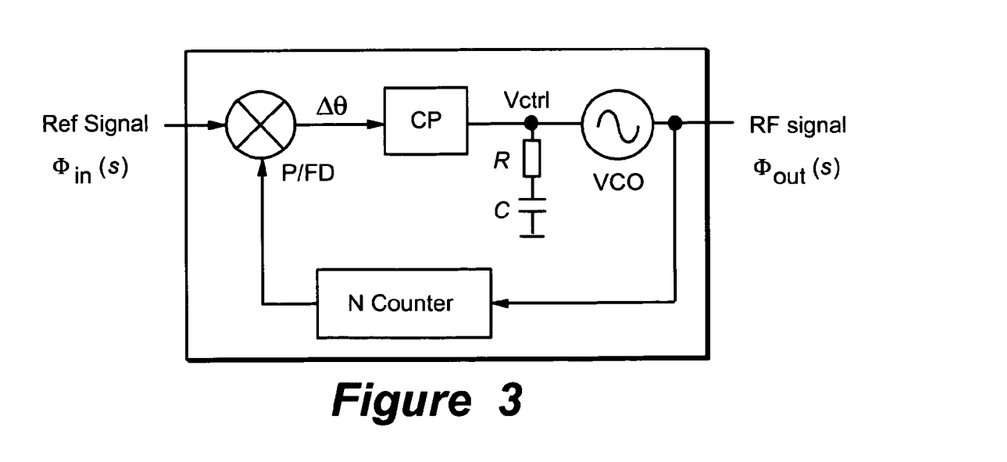
FIG. 3 shows a PLL that is used to synthesize a radio frequency carrier signal.

FIG. 3 shows a phase-locked loop (PLL) that is used to synthesize a radio frequency carrier signal. The PLL forms a feedback system that consists of a voltage-controlled oscillator (VCO), N counter, phase/frequency detector (P/FD), charge pump (CP) and RC integration filter.

Figure 4:
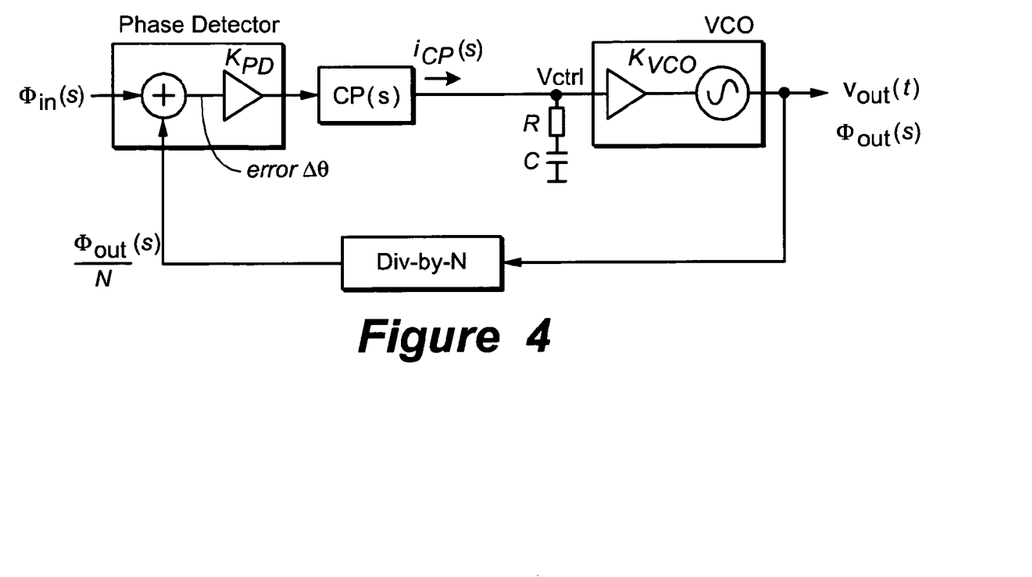
FIG. 4 shows a mathematical model of the PLL shown in FIG. 3.

FIG. 4 shows a mathematical model of the PLL shown in FIG. 3. The VCO produces an output signal at a frequency set by control voltage $v_{ctrl}$ that can be expressed as;

$$v_{out}(t)=A_c \cos(\omega_{free}t+K_{vco}\int v_{ctrl}(t)dt)$$

where $\omega_{free}$ is the free-running frequency of the VCO and $K_{vco}$ is its gain function. The gain function $K_{vco}$ describes the relationship between the excess phase of the carrier $\Phi_{out}(s)$ and the control voltage $v_{ctrl}$, i.e.;

$$\frac{\Phi_{out}(s)}{v_{ctrl}(s)} = \frac{K_{vco}}{s}$$

The N counter simply divides the output phase $\Phi_{out}(s)$ by N. When the PLL is locked, the phase detector (P/FD) and CP combination generate an output signal $i_{CP}(s)$ that is proportional to the phase difference $\Delta\theta$ between two periodic signals that are input to the P/FD. The output signal $i_{CP}(s)$ can be expressed as;

$$i_{CP}(s) = K_{PD}\frac{\Delta\theta(s)}{2\pi}$$

A simple integration filter, consisting of resistor R and capacitor C, transforms the output signal $i_{CP}(s)$ to the control voltage $v_{ctrl}$ as follows;

$$v_{ctrl}(s) = i_{out}(s)\left(R + \frac{1}{sC}\right)$$

Combining the above transfer functions yields the composite transfer function;

$$T(s) = \frac{K_{PD}K_{VCO}\left(Rs + \frac{1}{C}\right)}{s^2 + K_{PD}K_{VCO}\frac{1}{N}\left(Rs + \frac{1}{C}\right)}$$

where a zero (at 1/RC) has been added to the second order system to stabilize it.

The PLL generates an output signal at the frequency, $$f_{VCO}=Nf_{REF}$$

where N is the value of the N counter.

Figure 5:
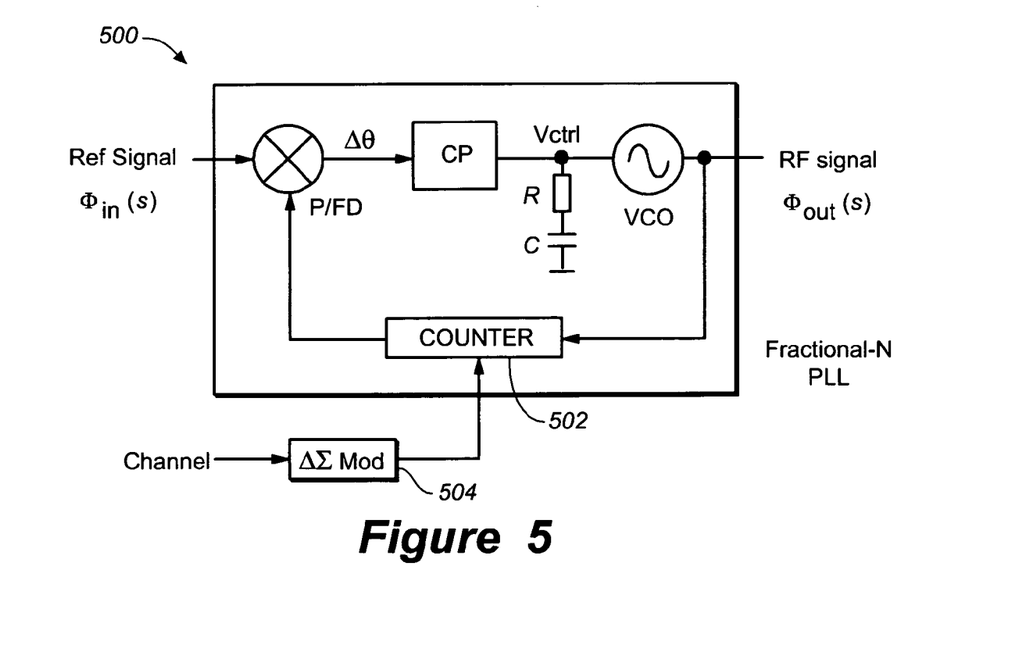
FIG. 5 shows one embodiment of a fractional-N PLL.

FIG. 5 shows one embodiment of a fractional-N PLL 500. In the PLL 500, N takes on fractional values by alternating between integer values of the counter 502. The alternating process is typically controlled and randomized by a $\Delta\Sigma$ modulator 504, which has the benefit of pushing spurious energy (due to the alternating values of N) outside the bandwidth of the PLL.

In practice, the counter 502 is a multi-modulus prescaler. It is typically controlled by a two-bit modulator that produces a random sequence that in turn selects one of four counter values, namely, n−1, n, n+1, and n+2. As the length of the random sequence grows, the effective value of N approaches, $$N=E[n]=n-p_{(n-1)}+p_{(n+1)}+2p_{(n+2)}$$

where p(n) is the probability of counter value n. Note that a three-bit modulator is also practical, and generates eight possible outputs that correspond to counter values from n−3, and n+4.)

Figure 6:
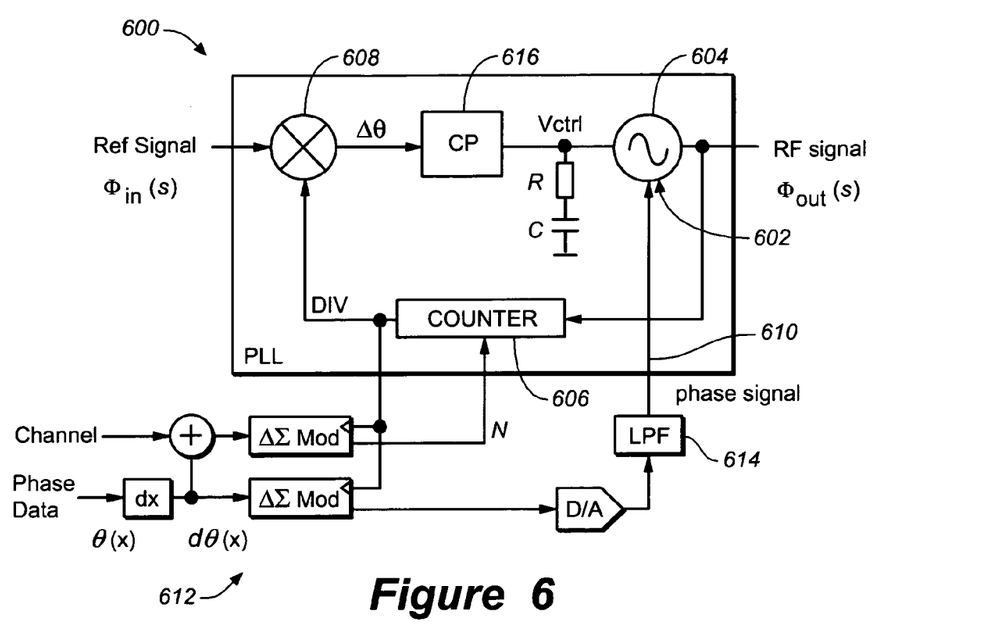
FIG. 6 shows one embodiment of a direct synthesis modulator that supports direct frequency or phase modulation in accordance with the present invention.

FIG. 6 shows one embodiment of a direct synthesis modulator 600 that supports direct frequency or phase modulation in accordance with the present invention. In one embodiment, the direct synthesis modulator 600 comprises a modification of a fractional-N PLL, for example, the fractional-N PLL shown in FIG. 5. The modulator 600 introduces modulation at an auxiliary port 602 of the VCO 604 and then attenuates it at the N counter 606, prior to the phase detector 608 so as to prevent attenuation of the modulation by the PLL's feedback. Note that the auxiliary port 602 of the VCO 604 controls the oscillator's frequency, not its phase. To shift the oscillator's phase, akin to phase modulation, the modulation signal must be differentiated with, $$f(t) = \frac{d}{dt}[f_c t + \theta(t)] = f_c + \frac{d\theta(t)}{dt}$$

where $f_c$ is the carrier frequency. Since the phase signal 610 is formed digitally and then converted to analog form, a simple digital difference circuit 612 is used to compute the derivative of the discrete phase data $\theta(x)$ as follows;

$$d\theta(x+1) = \theta(x+1) - d\theta(x)$$

where x is the sample index and $d\theta(x)$ is the difference or derivative. The differentiated data is then modulated to match the data rate of the control signal feeding the N counter 606. A low pass filter 614 smoothes the phase signal 610 before it is applied to the auxiliary port 602 of the VCO.

Phase modulation schemes generally operate linearly to achieve the prescribed phase shifts without distortion and frequency spreading. This is especially challenging for the direct synthesis approach because of three issues. First, the operation of the charge pump 616 and VCO 604 changes (at different levels of $v_{ctrl}$), affecting the response of the PLL. Second, the capacitance of the VCO 604 changes nonlinearly (as the control voltage at the auxiliary port (also referred to as the control voltage $v_{aux}$) moves and thus introduces distortion. Third, the PLL's feedback alters the applied modulation.

Figure 7:
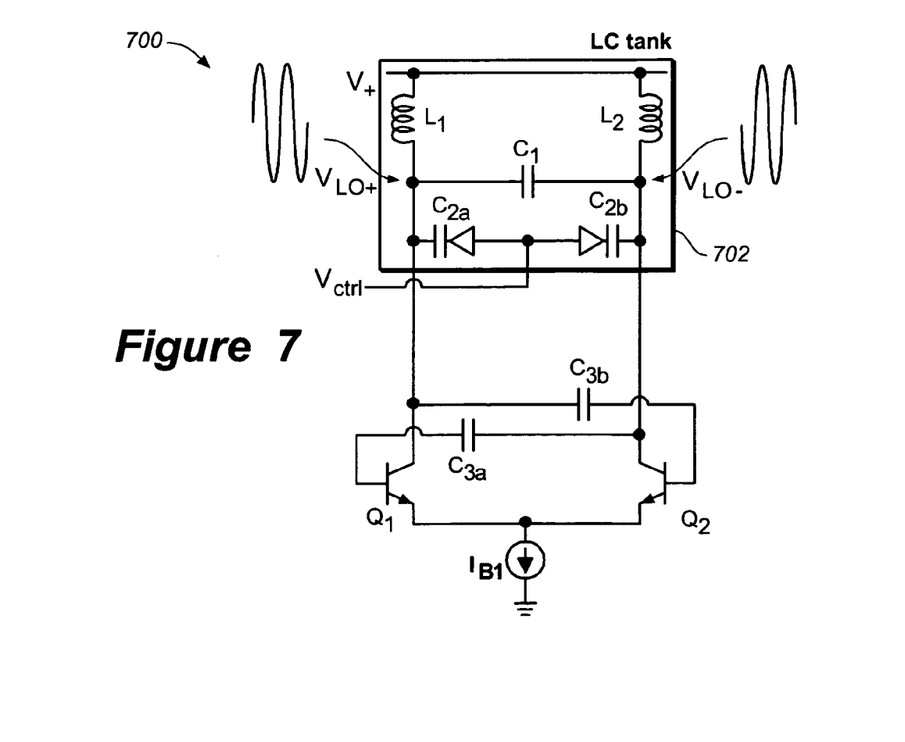
FIG. 7 shows a detailed view of a VCO.

FIG. 7 shows a detailed view of a VCO 700. The VCO 700 oscillates at a frequency set by the resonance of an LC tank circuit 702 that comprises inductors $L_1$, $L_2$ and capacitor $C_1$. A variable capacitor $C_2$ (shown as $C_{2a}$ and $C_{2b}$ and that can be realized as a varactor diode) allows the VCO 700 to be tuned to different radio frequencies. Ideally, the control signal $V_{ctrl}$ applied to the variable capacitor $C_2$ is midway between ground and V+ as this centers the operation of a charge pump circuit (not shown), which produces the control signal $V_{ctrl}$. In one embodiment, the desired range of the control signal $V_{ctrl}$ can be achieved by adding coarse-tuning capacitors to the tank circuit 702. The capacitors $C_{3a}$ and $C_{3b}$ cross-couple the output signal ($V_{LO}$) to a transistor differential pair (Q1, Q2) to sustain oscillation.

Figure 8:
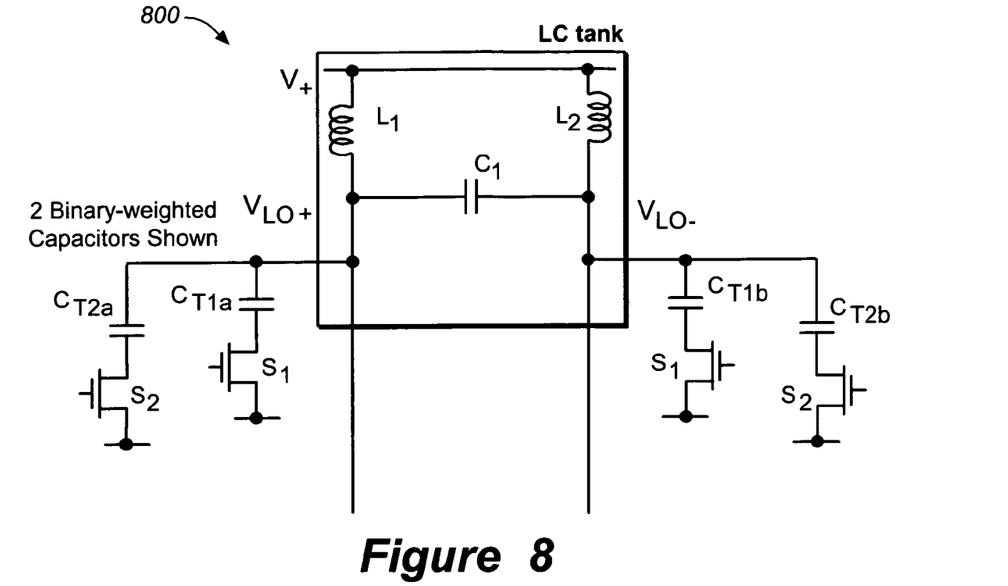
FIG. 8 shows one embodiment of a VCO tank circuit with coarse tuning capacitors suitable for use in a VCO in accordance with the present invention.

FIG. 8 shows one embodiment of a VCO tank circuit 800 with coarse tuning capacitors suitable for use in a VCO in accordance with the present invention. In one embodiment, the coarse tuning capacitors ($C_{T1a}$, $C_{T1b}$, $C_{T2a}$, and $C_{T2b}$) are binary weighted and subdivide the tuning range. In other embodiments, other capacitor weightings are possible. The switches ($S_{1a}$, $S_{2a}$, $S_{1b}$ and $S_{2b}$) operate to selectively connect the coarse tuning capacitors to the tank circuit and thereby adjust the control range of the control signal $v_{ctrl}$.

Figure 9:
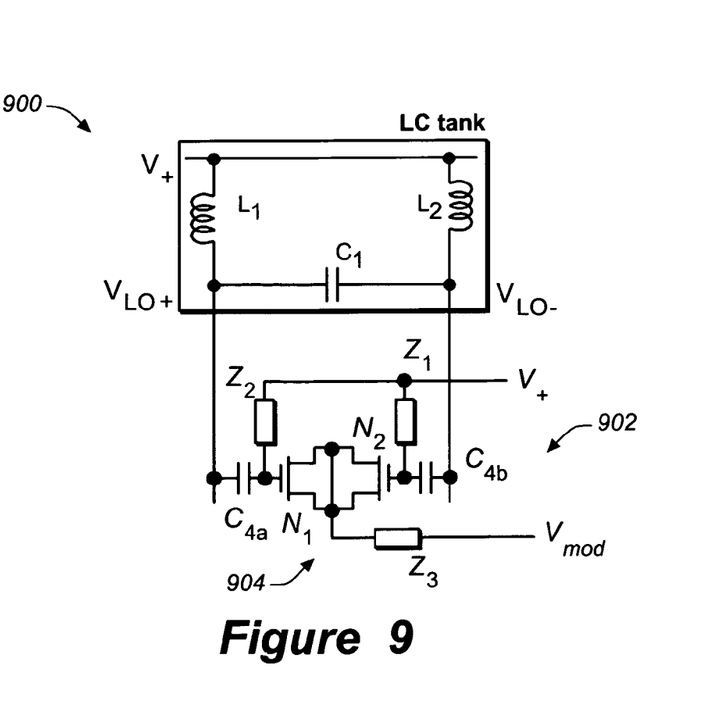
FIG. 9 shows one embodiment of a VCO tank circuit that includes an auxiliary port in accordance with the present invention.

FIG. 9 shows one embodiment of a VCO tank circuit 900 that includes an auxiliary port 902 in accordance with the present invention. The auxiliary port 902 comprises auxiliary circuitry 904 that is connected to the LC tank 900. The auxiliary circuitry 904 comprises MOSFET capacitors to achieve a linear response even though this device individually displays an abrupt response. The auxiliary circuitry 904 receives a voltage signal (V+) and a modification signal ($V_{mod}$) to adjust the operation of the tank circuit 900.

Figure 10:
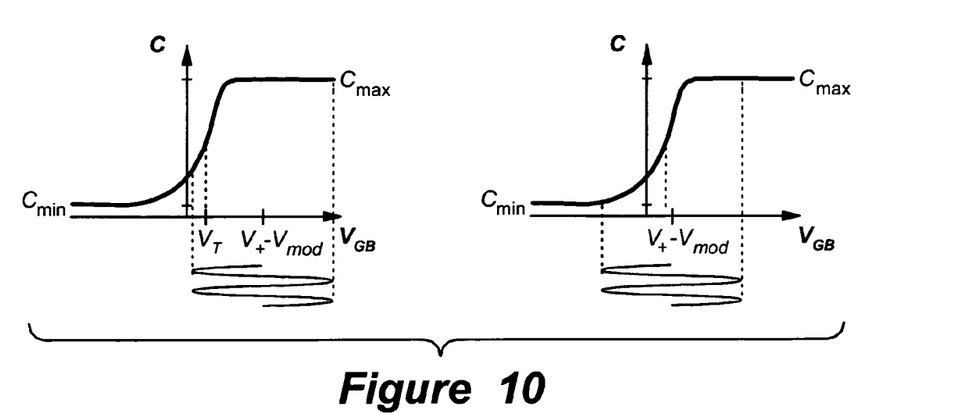
FIG. 10 shows graphs that illustrate how the auxiliary circuitry uses the MOSFET capacitor to achieve a linear response in accordance with the present invention.

FIG. 10 shows graphs that illustrate how the auxiliary circuitry 904 uses the MOSFET capacitor to achieve a linear response in accordance with the present invention. Linear response results because of the way the MOSFET transistor is used. The MOSFET transistor is nominally biased at its threshold voltage ($V_T$), corresponding to the transition in the capacitance curve expressed as;

$$V_{GB(nom)} = V_+ - V_{mod} = V_T$$

where $V_{GB}$ is the applied gate-to-bulk voltage. As the VCO output ($V_{LO}$) swings, the bias applied to the MOSFET switches its capacitance between two extreme values, $C_{min}$ and $C_{max}$, effectively averaging the two values. But, the phase modulation signal ($v_{mod}$, also referred to as $v_{aux}$) also affects the bias applied to the MOSFET capacitor. It shifts the time the MOSFET spends at each capacitance value, and since the time shifts linearly (with $v_{mod}$), the capacitance of the MOSFET ($C_{mos}$) changes linearly as follows;

$$C_{MOS} = \alpha C_{max} + (1-\alpha) C_{min}$$

where α is the time (expressed as a percentage of the VCO signal) that the MOSFET presents capacitance $C_{max}$, or equivalently, the time that $V_{GB} > V_T$.

Although the MOSFET capacitor shifts linearly, its initial capacitance changes with process parameters ($V_T$, $C_{min}$, and $C_{max}$). This may cause problems because it affects modulation accuracy and also prevents cancellation of the modulation by the N counter. The PLL feedback minimizes any leakage through the N counter (due to incomplete cancellation) by attenuating the intended phase modulation and thereby introducing distortion. To combat this, an innovative calibration scheme is utilized.

The calibration routine sets the VCO's modulation port gain ($K_{mod}$), which is defined as follows;

$$K_{mod} = \frac{1}{s} \frac{\Phi_{out}(s)}{v_{mod}(s)}$$

where $\Phi_{out}(s)/s$ corresponds to the excess frequency of the VCO and depends on the initial capacitance ($C_{min}$ and $C_{max}$) of the MOSFET structure. Scaling the modulation control voltage $V_{mod}$ compensates for capacitance differences.

Figure 11:
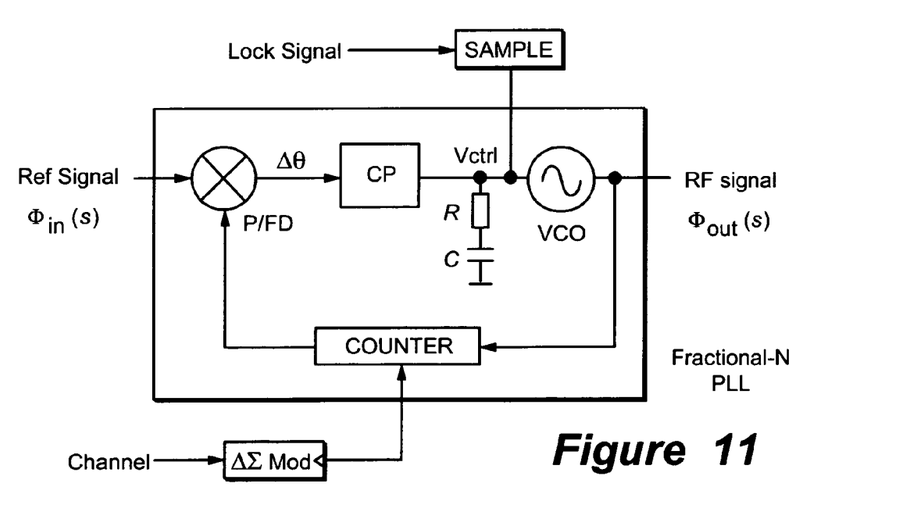
FIG. 11 shows how a lock signal output from a lock detector causes the control voltage $v_{ctrl}$ to be sampled and/or duplicated.

In one embodiment, a fractional-N PLL locks to the radio frequency designated by the channel data (N). Although this data pseudo-randomly alternates between integer values, the PLL—as evidenced by the control voltage $v_{ctrl}$—eventually settles. A lock detector monitors the settling response of the PLL and outputs a lock signal indicating when settling is complete. This in turn causes the control voltage to be sampled or duplicated as shown in FIG. 11. This is important because the control voltage $V_{ctrl}$ represents the nominal operating point of the PLL.

The modulation control voltage $V_{mod}$ is generated by a digital-to-analog converter (D/A) and is centered to its mid-value at the start of calibration. This ensures the modulation signal (dθ/dt) can change above and below the common mode level.

Figure 12:
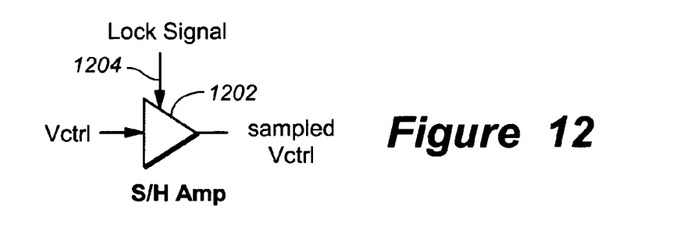
FIG. 12 shows a detailed diagram of one embodiment of a sampling circuit used to perform a $V_{ctl}$ sampling operation.

FIG. 12 shows a detailed diagram of one embodiment of a sampling circuit used to perform a $v_{ctl}$ sampling operation. The sampling circuit comprises a sample/hold amplifier 1202 controlled by a lock signal 1204 from the lock detector. Although simple, this circuit may be susceptible to hold droop—a phenomenon where the output of the sample/hold amplifier drifts back towards its common level.

Figure 13:
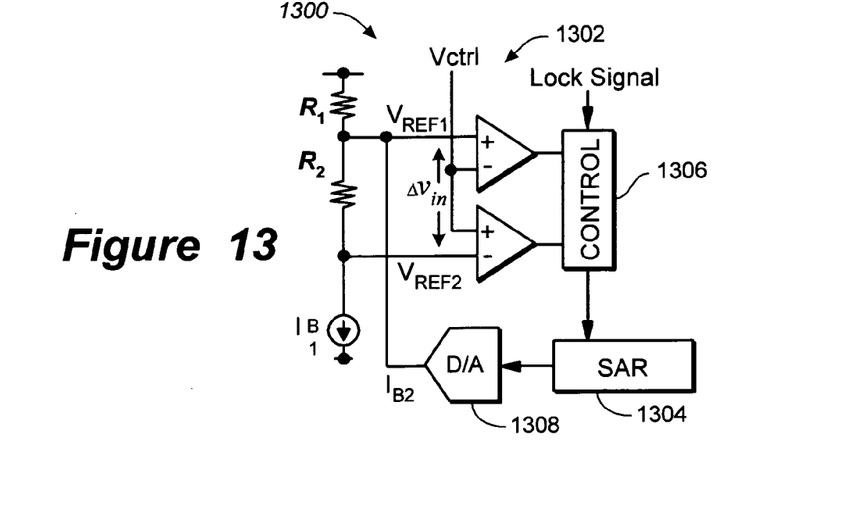
FIG. 13 shows one embodiment of another sampling circuit that uses a digital-to-analog converter to duplicate the control voltage $v_{ctrl}$.

FIG. 13 shows one embodiment of another sampling circuit 1300 that uses a digital-to-analog converter to duplicate the control voltage $v_{ctrl}$. In one embodiment, the sampling circuit 1300 operates to find the control voltage $v_{ctrl}$ according to a successive approximation algorithm 1400 illustrated in FIG. 14.

Figure 14:
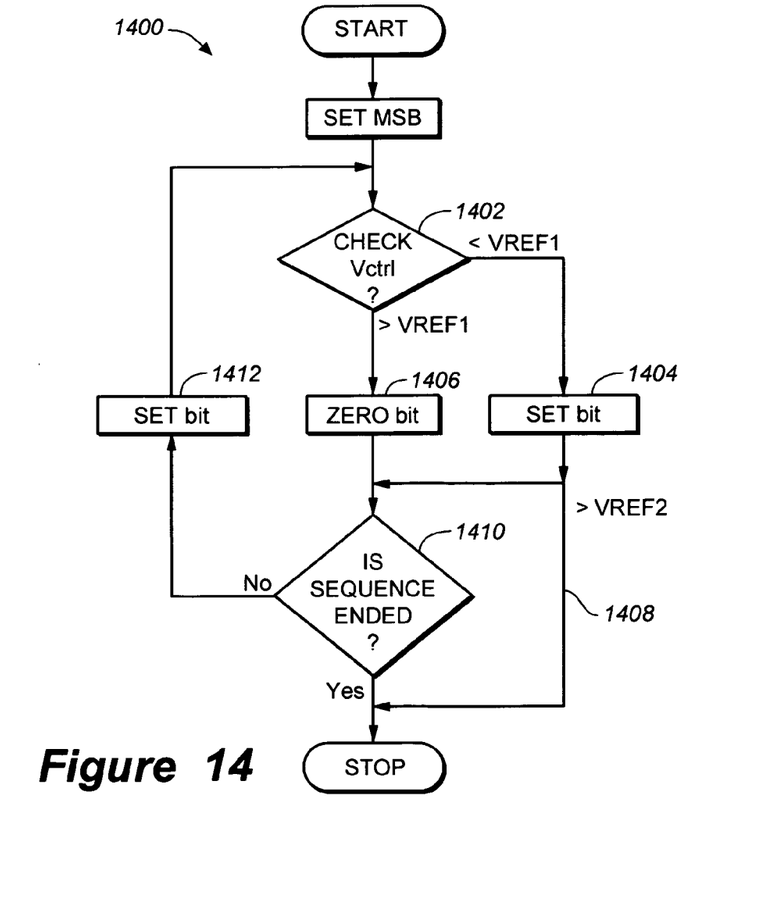
FIG. 14 shows a successive approximation algorithm for use with the sampling circuit shown in FIG. 13.

FIG. 14 shows the successive approximation algorithm 1400 for use with the sampling circuit 1300. Upon initialization of the algorithm 1400, the successive approximation register (SAR) 1304 is reset and a small current $I_{B1}$ is pulled through resistors $R_1$ and $R_2$ as shown in FIG. 13. This in turn offsets the two reference voltages ($V_{REF1}$ and $V_{REF2}$) as follows;

$$\Delta V = V_{REF1} - V_{REF2} = I_{B1} R_2$$

and thereby sets a window for the comparators 1302. Note that, initially, $V_{REF1}$ approximately equals $V_+$; consequently, the comparators indicate $V_{ctrl}$ is less than both $V_{REF1}$ and $V_{REF2}$. The control network 1306 then sets the first bit of the SAR 1304, which drives the most-significant-bit (MSB) of the D/A converter 1308. This establishes a current $I_{B2}$ that shifts both $V_{REF1}$ and $V_{REF2}$ as follows;

$$V_{REF1} = V_+ - (I_{B1} + I_{B2}) R_1, V_{REF2} = V_{REF1} - \Delta V$$

After the comparators 1302 settle, the control network 1306 interprets the results as shown at block 1402. The output of the top comparator indicates whether the SAR bit should be locked or cleared. The bit is locked (block 1404) when $v_{ctrl} < V_{REF1}$ and cleared (block 1406) when $v_{ctrl} > V_{REF1}$. Furthermore, if $V_{REF1} > v_{ctrl}$ and the bottom comparator shows that $v_{ctrl} > V_{REF2}$ (path 1408), the algorithm terminates because $v_{ctrl}$ lies inside the comparator window. Otherwise, if there are more bits to test (block 1410) the next SAR bit is set (block 1412) for testing and the above sequence is repeated. After completion of the $v_{ctrl}$ sampling algorithm 1400, the D/A converter 1308 holds a voltage nearly equal to (and within $\Delta V$ of) the control voltage $v_{ctrl}$.

Figure 15:
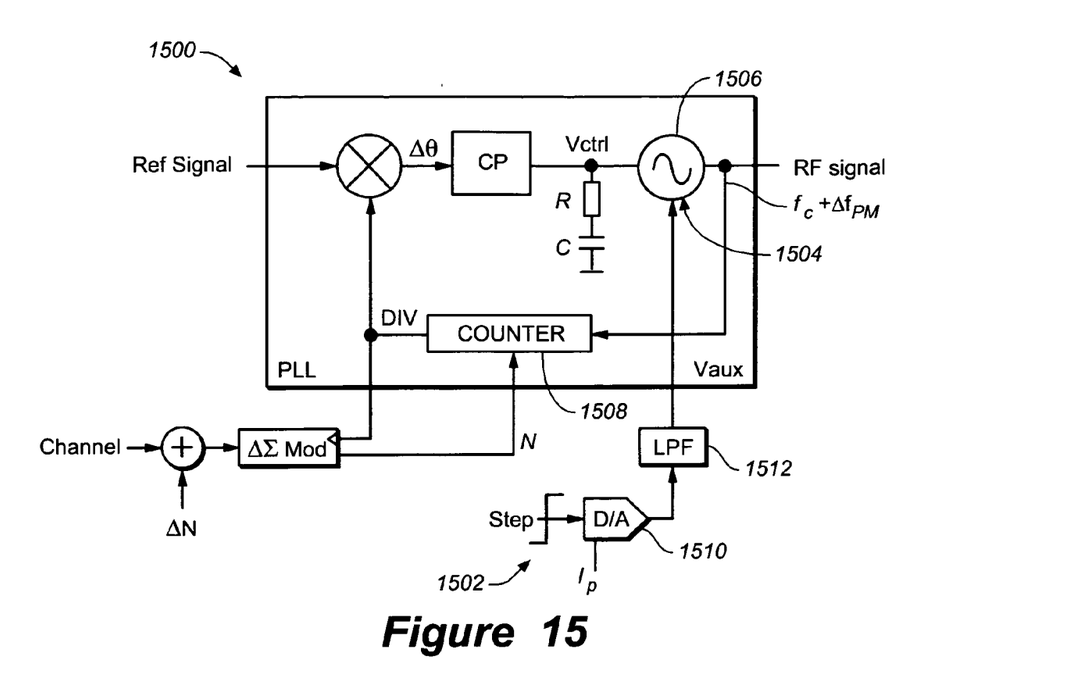
FIG. 15 shows one embodiment of a direct synthesis modulator that is part of the above calibration sequence after sampling the control voltage $v_{ctrl}$, is completed.

FIG. 15 shows one embodiment of a direct synthesis modulator 1500 that is part of the above calibration sequence after sampling the control voltage $v_{ctrl}$ is completed. A step input 1502 is applied directly to an auxiliary port 1504 of the VCO 1506, effectively raising its frequency of oscillation by $\Delta f_{PM}$. Simultaneously, the value applied to the N counter 1508 is adjusted to absorb this change in frequency. This is illustrated mathematically by the following;

$$f_{REF} = \frac{f_c}{N} \rightarrow \frac{f_c + \Delta f_{PM}}{N + \Delta N}$$

where fc is the frequency of the carrier signal. It follows then that the value N needs to be increased by;

$$\Delta N = \frac{\Delta f_{PM}}{f_{REF}}$$

to avoid changing fc.

A multiplying D/A converter 1510 interfaces to the auxiliary port 1504 of the VCO 1506. The converter 1510 translates the digital step input 1502 to an analog control voltage, scaling it according to a programmable current $I_P$. Ideally, the auxiliary control voltage $v_{aux}$ (or equivalently $V_{mod}$) exactly produces the intended frequency shift $\Delta f_{PM}$. In practice, the actual frequency shift can be higher or lower, depending on the characteristics of the MOSFET capacitor within the VCO 1506 and the programmable current $I_P$ feeding the D/A converter.

Figure 16:
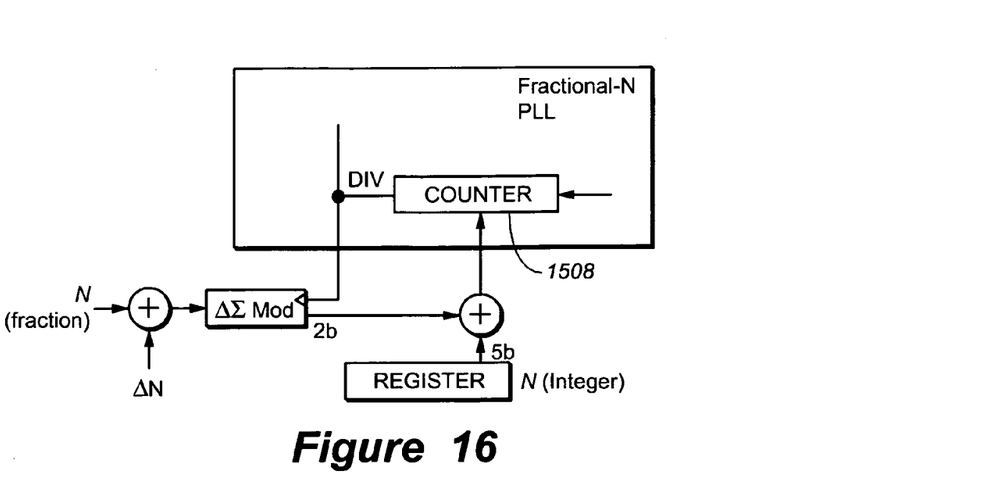
FIG. 16 shows how, in one embodiment, an adjustment $\Delta N$ is simply added to the fractional component of N used to $\Delta\Sigma$ modulate the counter shown in FIG. 15.

FIG. 16 shows how, in one embodiment, an adjustment $\Delta N$ is simply added to the fractional component of N used to $\Delta\Sigma$ modulate the counter 1508. This is practical because $\Delta f_{PM}$ is usually much less than $f_{REF}$.

The new inputs to the PLL included in direct synthesis modulator 1500 (frequency step and updated counter value) disturb the PLL and force the loop to adjust. Ideally, the PLL settles to the same operating point as before the inputs were applied. If this occurs, then the resulting control voltage $v_{ctrl}$ matches the sampled value, corresponding to the nominal operating point of the PLL. Otherwise, the change in $V_{ctrl}$ indicates the frequency step due to the modulation input $v_{aux}$ has not been cancelled by the loop. That is, if the control voltage $v_{ctrl}$ drifts lower, it means $\Delta f_{PM}$ was too small, forcing the loop to drive fc higher to compensate. Similarly, if the control voltage $v_{ctrl}$ shifts higher, it means $\Delta f_{PM}$ was too large.

Figure 17:
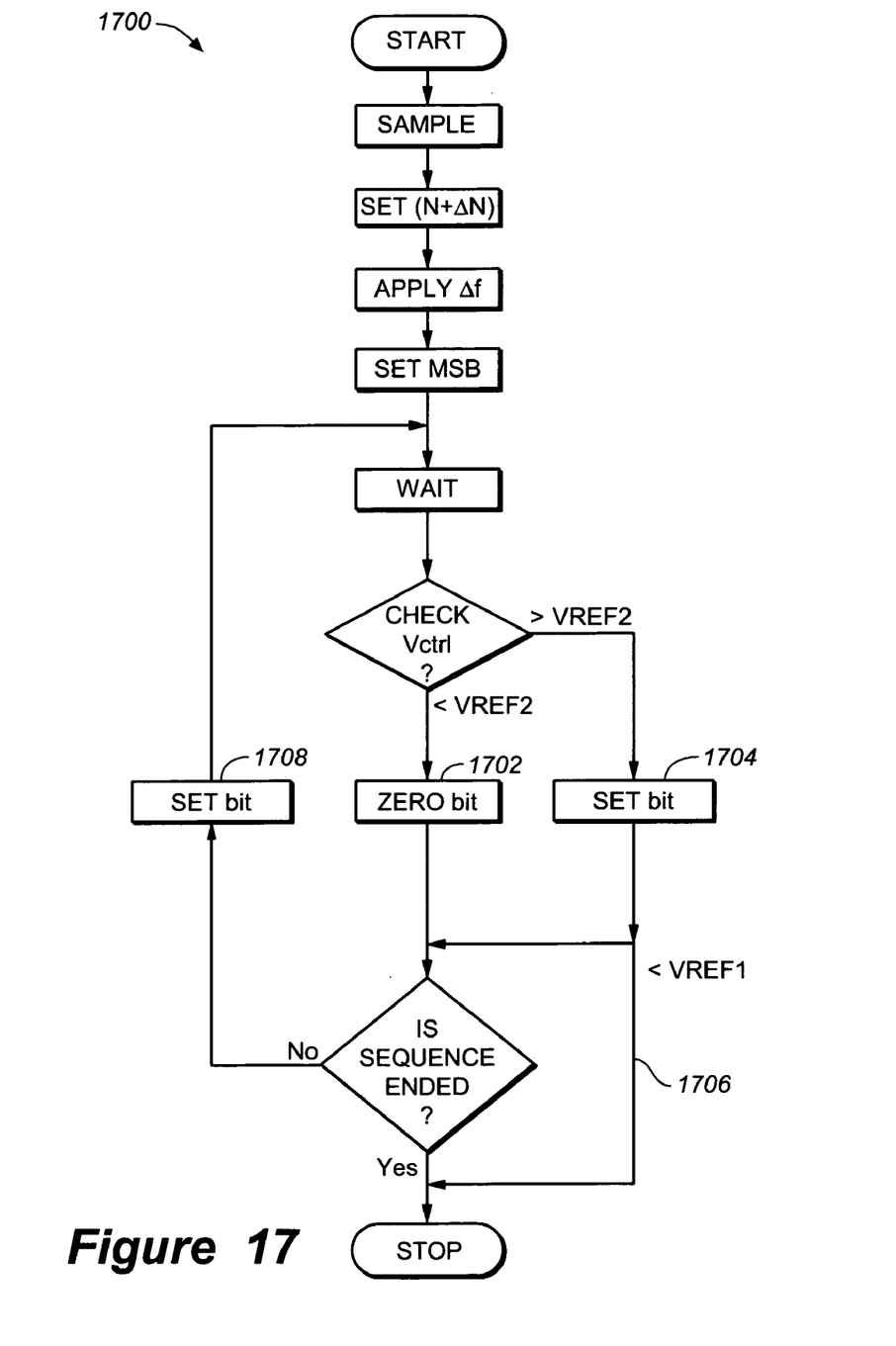
FIG. 17 shows one embodiment of a successive approximation algorithm used to adjust the programmable current $I_P$ in accordance with the present invention.
Figure 18:
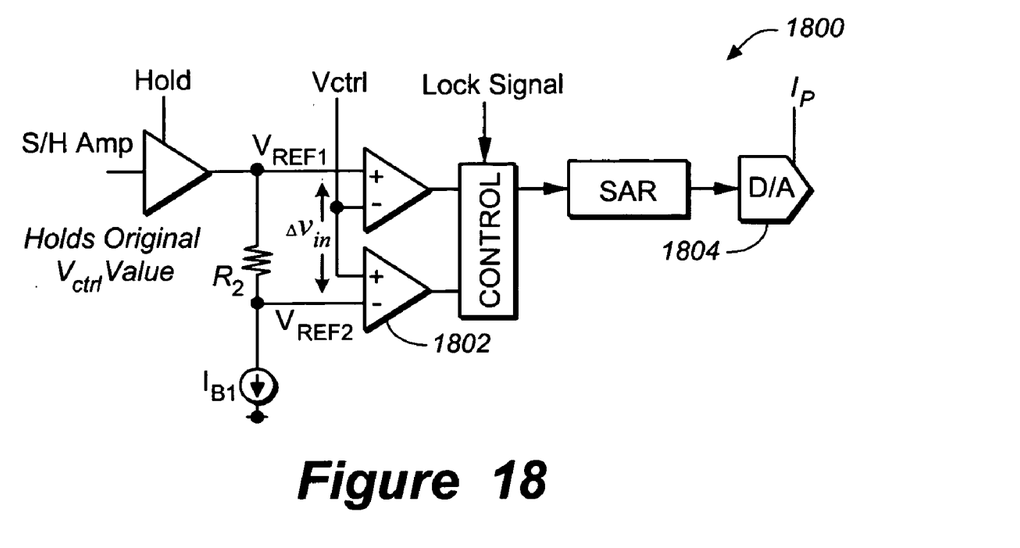
FIG. 18 show one embodiment of a network 1800 for generating the programmable current $I_P$ in accordance with the present invention.
Figure 19:
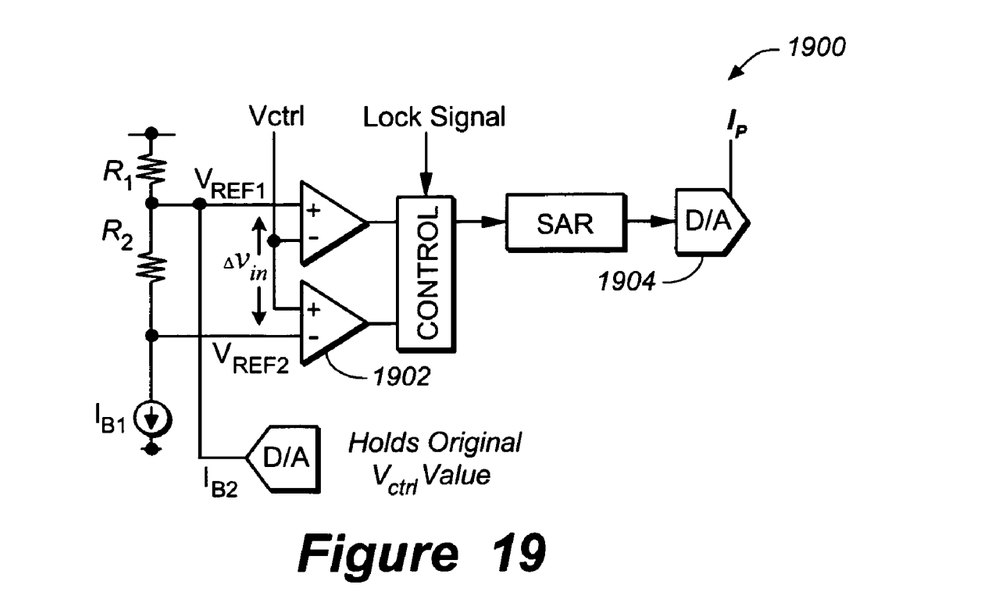
FIG. 19 show one embodiment of a network 1900 for generating the programmable current $I_P$ in accordance with the present invention.

FIG. 17 shows one embodiment of a successive approximation algorithm 1700 used to adjust the programmable current $I_P$ in accordance with the present invention. FIG. 18 show one embodiment of a network 1800 for generating the programmable current $I_P$ in accordance with the present invention. FIG. 19 show one embodiment of a network 1900 for generating the programmable current $I_P$ in accordance with the present invention.

The algorithm 1700 operates to match the resulting value of $v_{ctrl}$ to its sampled nominal value (stored by the S/H amplifier or alternatively by the D/A converter shown earlier in FIGS. 12 and 13, respectively). In one or more embodiments, the current $I_P$ is generated by a separate D/A converter that is initially set at midscale (by the MSB of the associated SAR), using the networks shown in FIGS. 18 and 19. The output of the bottom comparator (1802 or 1902) indicates whether the SAR bit should be locked or cleared. The bit is cleared when $V_{REF2} > v_{ctrl}$ (block 1702) and locked when $v_{ctrl} > V_{REF2}$ (block 1704). Furthermore, if $v_{ctrl} > V_{REF2}$ and the bottom comparator shows that $V_{REF1} > v_{ctrl}$, the algorithm terminates (path 1704) because $v_{ctrl}$ lies inside the comparator window and therefore matches the sampled value of $v_{ctrl}$ (the PLL's nominal operating point). Otherwise, the next SAR bit is set for testing (block 1708) and the above sequence is repeated. Upon completion of the calibration, the program current $I_P$ is properly set to meet the modulation accuracy requirements as well as prevent modulation leakage through the N counter (i.e., counter 1508).

It is important for the modulation control voltage $v_{aux}$ to remain centered at its mid-value, especially during calibration, as this fixes one of the calibration points. It follows that the program current $I_P$ sets the second calibration point, forcing the slope of the D/A converter (i.e., 1804 or 1904) and the gain associated with the VCO's modulation port ($K_{mod}$).

The output of the D/A converter consists of two complimentary currents $$I_{D/A} = mI_P + I_{offset}$$

where m is the digital modulation data and $I_{offset}$ is an offset current. This offset current tracks the program current $I_P$ such that;

$$I_{offset} = I_K - mid[m]I_P$$

with mid[m] equals the mid-value of the D/A converter and $I_K R$ corresponds to the desired mid-value of the modulation control voltage $v_{aux}$. Note that R is the effective resistance presented by the filter (i.e., filter 1512). In this way, the mid-value of the D/A converter stays constant during calibration.

The performance of the calibration routine depends on the accuracy of the sampling operation, the hold droop in the sample/hold amplifier, the offsets associated with the window comparator, the resolution of the D/A converter used to generate the program current $I_P$, and on the dynamics of the PLL loop. Sound analog design practices address most of these factors, except the last one, which is unique to the direct synthesis modulator.

The dynamics of the PLL loop impact modulation leakage. This is because it is difficult to exactly cancel the frequency modulation (dθ/dt) applied to the VCO. The value of N applied to the counter in a fractional-N PLL is resolved by alternating between integer values. As such, it takes a finite length (or equivalently, time) of the random data sequence to approach the intended N value.

Figure 20:
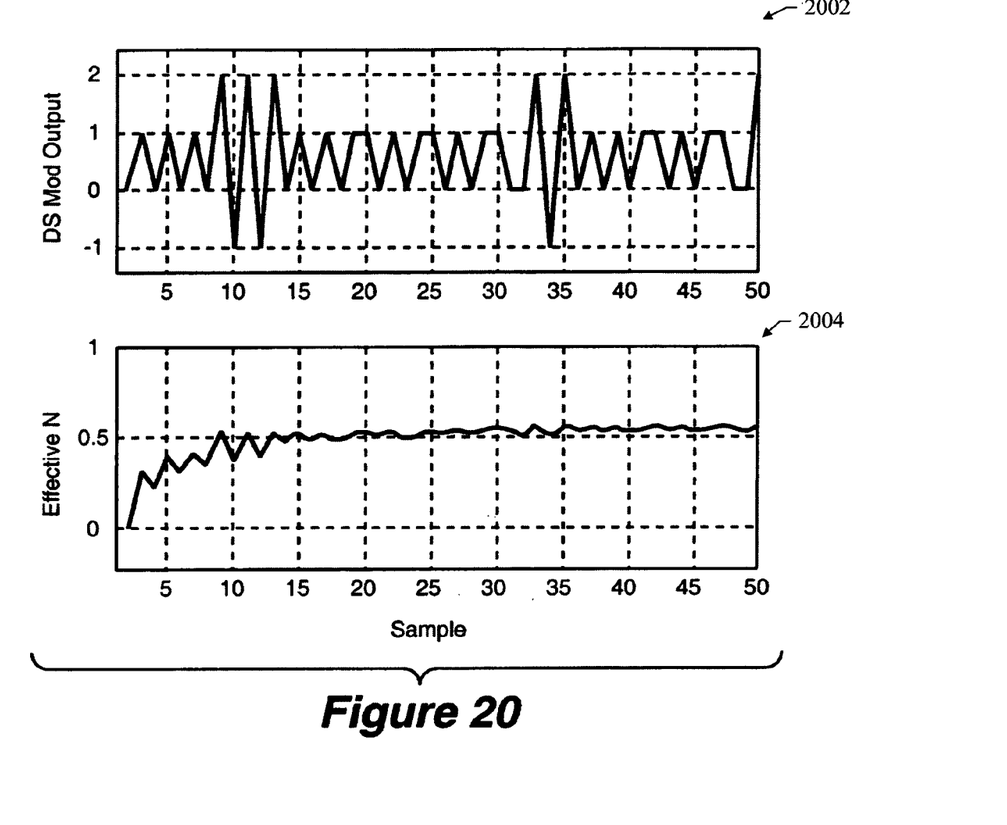
FIG. 20 shows graphs that illustrate the settling time for the $\Delta\Sigma$-modulated data representing the N value applied to the counter of the fractional-N PLL in accordance with the present invention.

FIG. 20 shows graphs that illustrate the settling time for the Δτ-modulated data representing the N value applied to the counter of the fractional-N PLL in accordance with the present invention. Graph 2002 shows a plot of the modulator output. Graph 2004 shows a plot illustrating how it takes a finite length (or equivalently, time) of the random data sequence to approach the intended N value. The necessary time is provided by making the PLL loop time constant (reciprocal of the loop bandwidth) large. As a result, the loop attenuates higher frequency modulation, while the counter and the ΔN data cancel lower frequency modulation.

This innovative calibration routine—based on the control voltage applied to the VCO of a direct synthesis modulator—provides the necessary accuracy for direct phase modulation.

Figure 21:
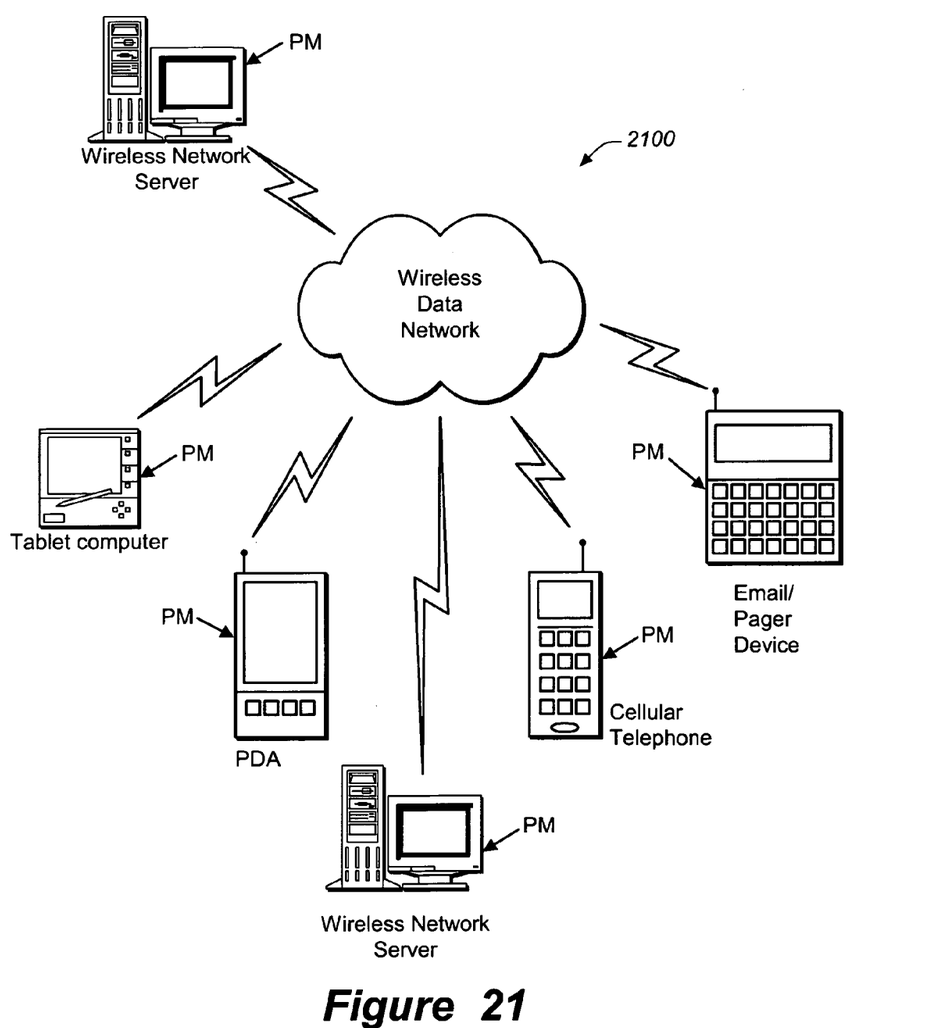
FIG. 21 shows a communication network 2100 that includes various communication devices that comprise a highly-linear phase modulator constructed in accordance with the present invention.

FIG. 21 shows a communication network 2100 that includes various communication devices. The devices include a highly-linear phase modulator (PM) constructed in accordance with the present invention. The network 2100 includes multiple network servers, a tablet computer, a personal digital assistant (PDA), a cellular telephone, and an email/pager device all communicating over a wireless data network. Each of the devices includes a highly linear phase modulator in accordance with the present invention. The network 2100 illustrates only some of the devices that may comprise one or more embodiments included in the present invention. However, one or more embodiments included in the present invention are suitable for use in virtually any type of communication device.

In one or more embodiments, a system for highly linear phase modulation is provided. Accordingly, while one or more embodiments of a phase modulator system have been illustrated and described herein, it will be appreciated that various changes can be made to the embodiments without departing from their spirit or essential characteristics. Therefore, the disclosures and descriptions herein are intended to be illustrative, but not limiting, of the scope of the invention, which is set forth in the following claims.

What is claimed is:

1. A phase lock loop circuit that operates to produce a linear phase modulation signal, the phase lock loop circuit comprising:
   oscillator means for producing a modulation signal based on a first oscillator control signal and a second oscillator control signal;
   counter means for receiving the modulation signal and a counter control signal to produce a counter output signal that is used to derive the first oscillator control signal; and
   calibration means for outputting the second oscillator control signal and the counter control signal, wherein the calibration means operates to adjust a frequency offset provided by the second oscillator control signal until canceling the effects of a frequency characteristic resulting from the counter control signal.

2. The phase lock loop circuit of claim 1, wherein the calibration means comprises means for receiving phase data and producing a derivative of the phase data that is used to generate the second oscillator control signal and the counter control signal.

3. The phase lock loop circuit of claim 2, wherein the calibration means comprises:
   first modulator means for receiving the derivative of the phase data and producing a digital modulation signal;
   digital-to-analog converter means for receiving the digital modulation signal and produce an analog modulation signal; and
   filter means for receiving the analog modulation signal and producing the second oscillator control signal.

4. The phase lock loop circuit of claim 2, wherein the calibration means comprises:
   combining means for combining the derivative of the phase data and channel data to produce a combined modulation signal; and
   second modulator means that operates to receive the combined modulation signal and produce the counter control signal.

5. A communication device comprising a phase lock loop circuit that operates to produce a linear phase modulation signal, the phase lock loop circuit comprising:
   oscillator means for producing a modulation signal based on a first oscillator control signal and a second oscillator control signal;
   counter means for receiving the modulation signal and a counter control signal to produce a counter output signal that is used to derive the first oscillator control signal; and
   calibration means for outputting the second oscillator control signal and the counter control signal, wherein the calibration means operates to adjust a frequency offset provided by the second oscillator control signal until canceling the effects of a frequency characteristic resulting from the counter control signal.

6. The communication device of claim 5, wherein the calibration means comprises means for receiving phase data and producing a derivative of the phase data that is used to generate the second oscillator control signal and the counter control signal.

7. The communication device of claim 6, wherein the calibration means comprises:

first modulator means for receiving the derivative of the phase data and producing a digital modulation signal;

digital-to-analog converter means for receiving the digital modulation signal and produce an analog modulation signal; and filter means for receiving the analog modulation signal and producing the second oscillator control signal.

8. The communication device of claim 6, wherein the calibration means comprises:

combining means for combining the derivative of the phase data and channel data to produce a combined modulation signal; and second modulator means that operates to receive the combined modulation signal and produce the counter control signal.

\* \* \* \* \*